United States Patent
Xie et al.

(10) Patent No.: US 9,847,390 B1
(45) Date of Patent: Dec. 19, 2017

(54) SELF-ALIGNED WRAP-AROUND CONTACTS FOR NANOSHEET DEVICES

(71) Applicant: GLOBALFOUNDRIES INC., Grand Cayman (KY)

(72) Inventors: Ruilong Xie, Schenectady, NY (US); Chanro Park, Clifton Park, NY (US); Min Gyu Sung, Latham, NY (US); Hoon Kim, Horseheads, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/434,205

(22) Filed: Feb. 16, 2017

(51) Int. Cl.
| | |
|---|---|
| *H01L 21/00* | (2006.01) |
| *H01L 29/06* | (2006.01) |
| *H01L 29/417* | (2006.01) |
| *H01L 29/08* | (2006.01) |
| *H01L 29/423* | (2006.01) |
| *H01L 21/02* | (2006.01) |
| *H01L 29/161* | (2006.01) |
| *H01L 29/786* | (2006.01) |
| *H01L 29/66* | (2006.01) |
| *H01L 29/45* | (2006.01) |

(52) U.S. Cl.
CPC .... *H01L 29/0673* (2013.01); *H01L 21/02532* (2013.01); *H01L 29/0847* (2013.01); *H01L 29/161* (2013.01); *H01L 29/41733* (2013.01); *H01L 29/41783* (2013.01); *H01L 29/42392* (2013.01); *H01L 29/45* (2013.01); *H01L 29/665* (2013.01); *H01L 29/66742* (2013.01); *H01L 29/78684* (2013.01)

(58) Field of Classification Search
CPC .......... H01L 21/02532; H01L 29/0673; H01L 29/0847; H01L 29/161; H01L 29/41733; H01L 29/41783; H01L 29/42392; H01L 29/45; H01L 29/665; H01L 29/66742; H01L 29/78684
See application file for complete search history.

(56) References Cited

U.S. PATENT DOCUMENTS

| | | | |
|---|---|---|---|
| 9,209,246 B2 | 12/2015 | Fonash et al. | |
| 2013/0285149 A1 | 10/2013 | Fonash et al. | |
| 2014/0001520 A1* | 1/2014 | Glass | H01L 29/66439 257/288 |
| 2016/0365411 A1 | 12/2016 | Yeh et al. | |

* cited by examiner

*Primary Examiner* — Nicholas Tobergte
(74) *Attorney, Agent, or Firm* — Francois Pagette; Hoffman Warnick LLC

(57) ABSTRACT

This disclosure relates to forming a wrap-around contact on a nanosheet transistor, the method including: forming an etch-stop layer over a continuous outer surface of a raised source/drain (S/D) region of the nanosheet transistor; forming a sacrificial layer over the etch-stop layer, the etch-stop layer including a different material than the sacrificial layer; depositing a dielectric layer over the sacrificial layer; removing an upper portion of the dielectric layer to expose a portion of the sacrificial layer; removing the sacrificial layer selective to the etch-stop layer; and depositing a conductor in the removed upper portion of the dielectric layer to form a wrap-around contact and a second contact.

20 Claims, 10 Drawing Sheets

US 9,847,390 B1

SELF-ALIGNED WRAP-AROUND CONTACTS FOR NANOSHEET DEVICES

BACKGROUND

Technical Field

The present disclosure relates to semiconductor design, and more particularly to forming wrap-around contacts for nanosheet transistor devices.

Related Art

A nanosheet transistor refers to a type of field-effect transistor (FET) that includes a plurality of stacked nanosheets extending between a pair of source/drain regions. A FET typically includes doped source/drain regions that are formed in a semiconductor substrate and separated by a channel region. A gate insulation layer is positioned above the channel region and a conductive gate electrode is positioned above the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designers have greatly reduced the physical size of FETs over the years. More specifically, the channel length of FETs can be scaled down significantly, which can improve the switching speed of the FETs. A number of challenges arise as feature sizes of FETs and ICs get smaller. For example, significant downsizing of traditional planar FETs leads to electrostatic issues and electron mobility degradation. Scaled-down planar FETs have shorter gate lengths that make it more difficult to control the channel. New device architectures such as "gate-all-around" nanowire or nanosheet structures allow further scaling of ICs, in part because the gate wraps around the channel and provides better control with lower leakage current, faster operations, and lower output resistance.

In nanosheet FETs, a wrap-around contact (WAC) may be formed over the entire outer surface of source/drain regions in order to reduce resistance in the nanosheet FET. In previous methods, in order to ensure that the WAC is formed around the entire outer surface of the source/drain regions, a large contact area is etched over the source/drain regions such that each outer surface of the source/drain regions are exposed, even in a worst-case misalignment scenario. In order to ensure that the WAC is formed around the entire outer surface of the source/drain regions at the worst-case alignment scenario using previous methods, the contact area is made significantly wider than the nanosheets. The large contact area limits the device scaling because the space between individual nanosheet stacks is limited by the width of the contact area used to form the WAC.

SUMMARY

A first aspect of the disclosure provides a method including: forming a nanosheet structure on a substrate, the nanosheet structure including a gate disposed on a plurality of alternating first sacrificial layers and nanosheets; forming a raised source/drain (S/D) region on the substrate adjacent to the nanosheet structure such that the nanosheets extend between the raised S/D region, and the raised S/D region has a continuous outer surface that includes an upper surface and a side surface; forming an etch-stop layer on the continuous outer surface of the raised S/D region; forming a second sacrificial layer over the etch-stop layer, the etch-stop layer including a different material than the second sacrificial layer; depositing a dielectric layer over the second sacrificial layer; removing an upper portion of the dielectric layer to expose a portion of the second sacrificial layer; removing the second sacrificial layer selective to the etch-stop layer; and depositing a conductor in the removed upper portion of the dielectric layer to form a wrap-around contact over the etch-stop layer and a second contact above the wrap-around contact.

A second aspect of the disclosure provides a method of forming a wrap-around contact on a nanosheet transistor, the method including: forming an etch-stop layer over a continuous outer surface of a raised source/drain (S/D) region of the nanosheet transistor; forming a sacrificial layer over the etch-stop layer, the etch-stop layer including a different material than the sacrificial layer; depositing a dielectric layer over the sacrificial layer; removing an upper portion of the dielectric layer to expose a portion of the sacrificial layer; removing the sacrificial layer selective to the etch-stop layer; and depositing a conductor in the removed upper portion of the dielectric layer to form a wrap-around contact and a second contact.

A third aspect of the disclosure provides an apparatus including: a nanosheet stack disposed on a substrate; a metal gate disposed on the nanosheet stack; a raised source/drain (S/D) region disposed on the substrate and adjacent to the nanosheet stack such that the nanosheets extend between the source/drain region; a silicon etch-stop layer disposed on the raised S/D region; a wrap-around contact wrapped around the silicon etch-stop layer; and a second contact disposed on the wrap-around contact, wherein a widest portion of the second contact is narrower than a widest portion of the wrap-around contact.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
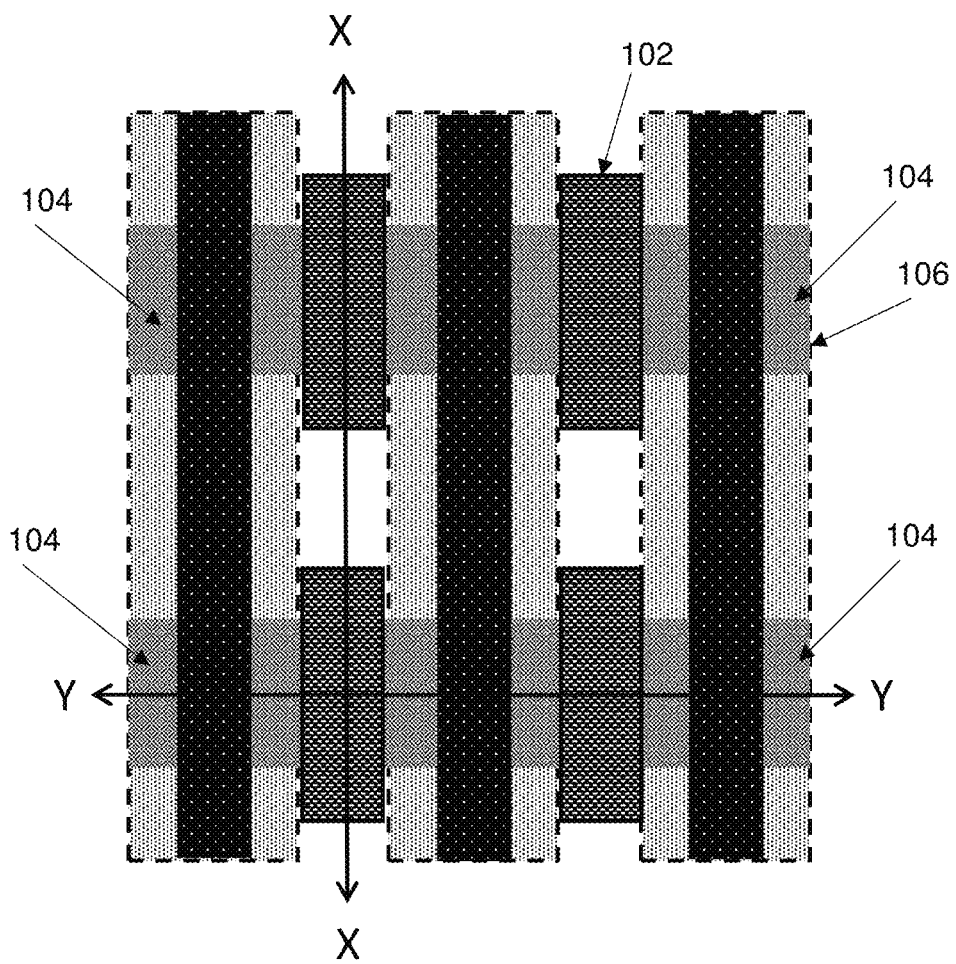
FIG. 1 shows a plan view of a plurality of nanosheet stacks and adjacent source/drain regions in accordance with the present disclosure.

Embodiments of the present disclosure provide methods for forming self-aligned wrap-around contacts (WAC) for nanosheet transistor devices that may be utilized in integrated circuits (IC). A nanosheet transistor refers to a transistor with a gate disposed on a nanosheet stack between a pair of source/drain regions, and a plurality of nanosheets extending between the pair of source/drain regions. The nanosheets are spaced apart vertically by sacrificial layers. A wrap-around contact (WAC) refers to a contact layer formed around the outer surface of each of the source/drain regions. The WAC being wrapped around the outer surface of the source/drain regions enables a lower resistance in the resulting nanosheet transistor device due to a large area of contact between the WAC and the source/drain region. In previous methods, in order to ensure that the WAC is formed around the outer surface of the source/drain region, a large contact area is etched over the source/drain region such that each outer surface of the source/drain region is exposed, even in a worst-case misalignment scenario. In order to ensure a sufficiently formed WAC at the worst-case alignment scenario using previous methods, the contact area is formed significantly wider than the nanosheets. The previous methods limit the device scaling because the space between individual nanosheet stacks is limited by the width of the contact area.

The present disclosure provides a method of forming a self-aligned WAC that uses a much smaller contact such that the size of the contact may not limit the device scaling. The wrap-around contact and second (upper) contact of the present disclosure may allow for better scaling while reducing contact resistance and spreading resistance. The resulting ICs may be made smaller due to more densely packed nanosheet transistors, while maintaining reliability in manufacturing. This may be accomplished by reducing the area of second (upper) contacts while ensuring that the wrap-around contact is formed around the outer surface of the source/drain regions in a worst-case alignment scenario.

It is to be understood that the present disclosure will be described in terms of a given illustrative architecture having a silicon substrate, however other architectures, structures, substrate materials, and process features and steps may be varied within the scope of the present disclosure.

It will also be understood that when an element such as a lay, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of integrated circuit (IC) chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (a) only, or the selection of the second listed option (B) only, or the selection of both options (A and B). As a further example, in the cases of "A, B, and/or C" and "at least one of A, B, and C", such phrasing is intended to encompass the first listed option (A) only, or the selection of the second listed option (B) only, or the selection of the third listed option (C) only, or the selection of the first and the second listed options (A and B), or the selection of the first and third listed options (B and C) only, or the selection of the second and third listed options (B and C) only, or the selection of all three options (A and B and C). This may be extended, as readily apparent by one of ordinary skill in the art, for as many items listed.

Referring now to the drawings in which like numerals represent the same or similar elements and initially to FIG. 1 showing a plan view of a plurality of nanosheet stacks 104 and adjacent source/drain regions 102. FIG. 1 shows cross-section line Y-Y which extends along nanosheets 106 and parallel to nanosheets 106. FIG. 1 also shows cross-section line X-X which extends perpendicular to nanosheets 106 along source/drain regions 102.

Figure 2A:
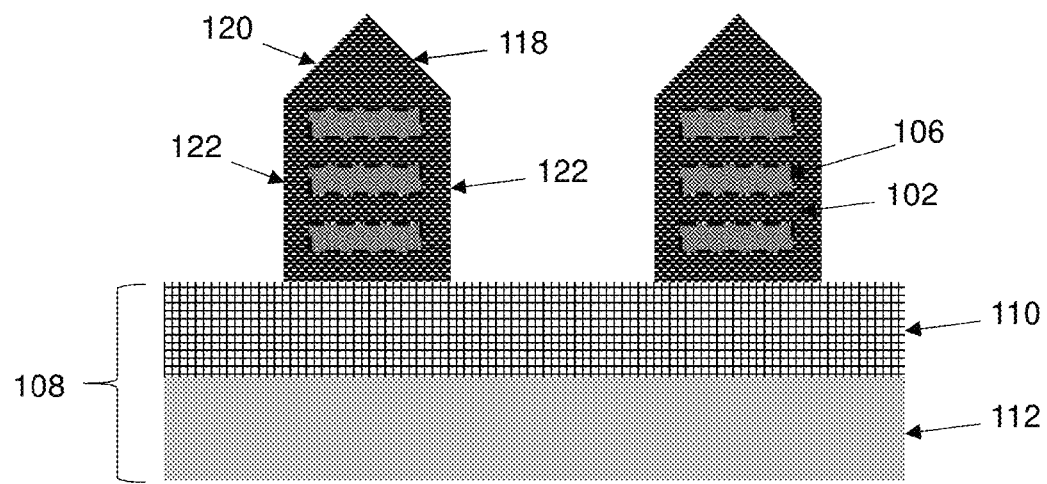
FIG. 2A shows a cross-sectional view, along line X-X in FIG. 1, of source/drain regions formed on a substrate in accordance with the present disclosure.
Figure 2B:
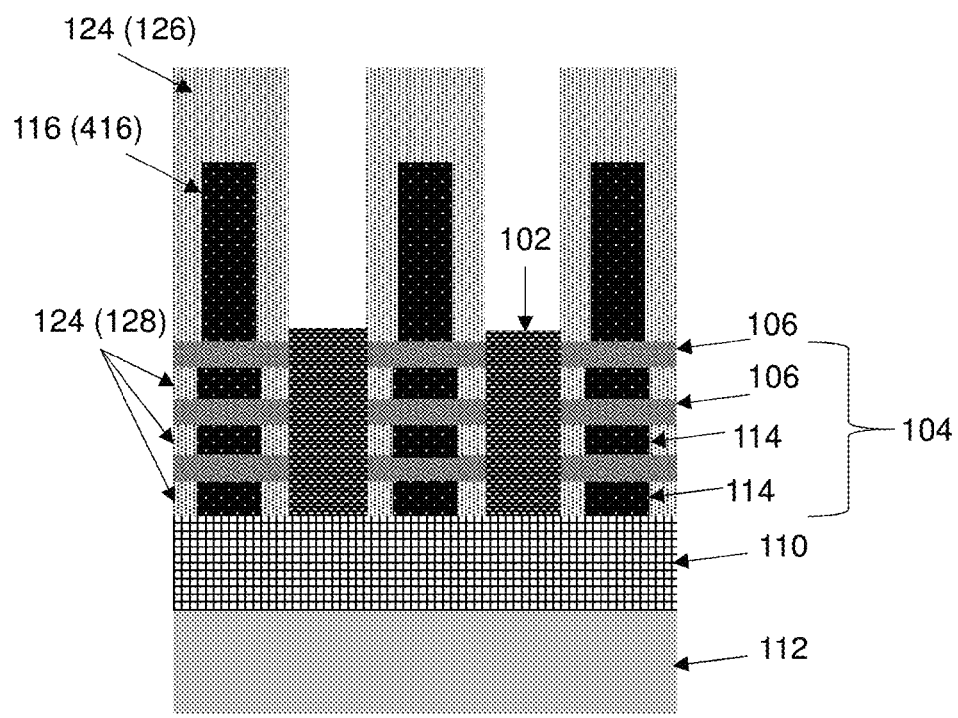
FIG. 2B shows a cross-sectional view, along line Y-Y in FIG. 1, of nanosheet stacks and adjacent source/drain regions formed on the substrate in accordance with the present disclosure.

FIGS. 2A and 2B show a step of forming a plurality of nanosheet stacks 104 on a substrate 108. Each of the plurality of nanosheet stacks 104 may include a plurality of alternating sacrificial layers 114 and nanosheets 106. A gate 116 may be disposed on each of the nanosheet stacks 104. FIG. 2A shows a cross-section of the step along line X-X in FIG. 1. FIG. 2B shows a cross-section of the step along line Y-Y in FIG. 1. This orientation carries through the drawings. In one embodiment, sacrificial layers 114 may include silicon germanium (SiGe). Nanosheets 106 may include a semiconducting material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In one particular embodiment, nanosheets 106 may include silicon. In one embodiment, nanosheets 106 may include silicon (Si). In one embodiment, nanosheet stacks 104 may include alternating layers of SiGe sacrificial layers 114 and Si nanosheets 106. Nanosheet stacks 104 may include at least one nanosheet 106. In one embodiment, nanosheet stacks 104 include three nanosheets 106. Substrate 108 may include a buried insulator layer 110 over a bulk semiconductor layer 112. Buried insulator layer 110 may include, for example, silicon oxide, and semiconductor layer 112 may include any semiconductor material listed for nanosheets 106. FIGS. 2A and 2B also show a step of forming a plurality of raised source/drain (S/D) regions 102 on substrate 108. A raised S/D region 102 may be formed adjacent to a nanosheet stack 104 such that nanosheets 106 extend between portions of an adjacent raised S/D region 102. Nanosheets 106 are shown in phantom in FIG. 2A for positional reference and clarity, however it should be understood that nanosheets 106 do not extend through S/D regions 102. In one embodiment, nanosheets 106 extend between adjacent S/D regions 102 and do not extend through S/D regions 102. Each S/D region may have a continuous outer surface 118 that may include an upper surface(s) 120 and side surface(s) 122. In one embodiment, S/D regions 102 may be epitaxially grown. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces. In one particular embodiment, S/D regions 102 may be formed by epitaxially growing heavily doped silicon (Si) or silicon germanium (SiGe). Spacers 124 may be formed over gates 116 using any now known or later developed techniques, e.g., deposition of silicon nitride (SiN). For example, in one embodiment, an upper spacer 126 may include a hard mask material, such as SiN, deposited on gate 116. In such an embodiment, offset spacers 128 may be formed by removing a portion of sacrificial layers 114 selective to nanosheets 106, and depositing SiN to replace the removed portions of sacrificial layers 114. Formation of spacers 124 may include a spacer pull-down formation process, sidewall image transfer, atomic layer deposition (ALD), reactive ion etching (RIE), or any other now known or later developed techniques.

Figure 3A:
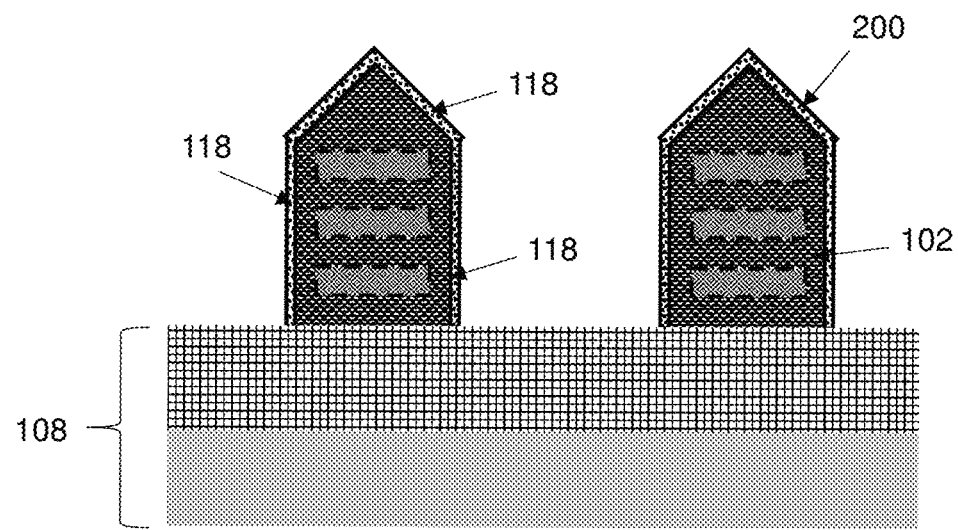
FIG. 3A shows a cross-sectional view, along line X-X in FIG. 1, of forming an etch-stop layer on the source/drain regions in accordance with the present disclosure.
Figure 3B:
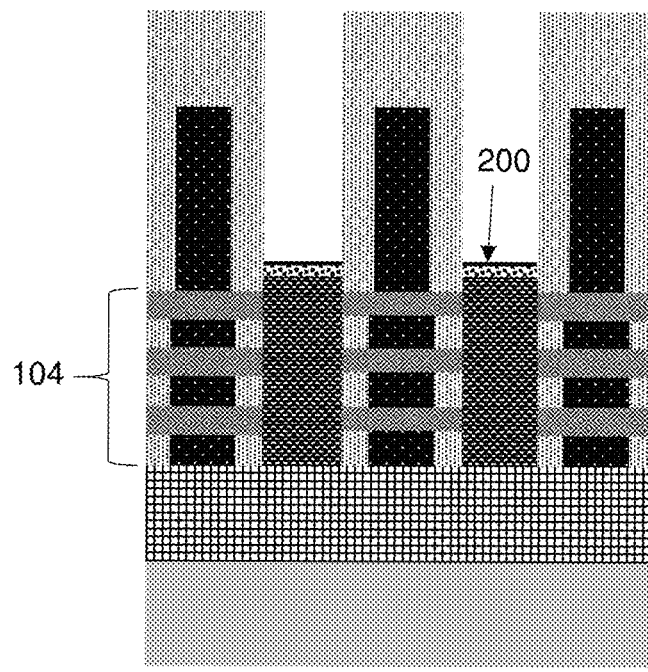
FIG. 3B shows a cross-sectional view, along line Y-Y in FIG. 1, of forming the etch-stop layer on the source/drain regions in accordance with the present disclosure.

FIGS. 3A and 3B show a step of forming an etch-stop layer 200 on continuous outer surface 118 of raised S/D region 102. Etch-stop layer 200 may be formed of a different material than raised S/D region 102. In one embodiment, etch-stop layer 200 may be formed to a thickness of 1-3 nanometers. The etch-stop layer may be made of undoped silicon (Si). In one embodiment, etch-stop layer 200 may be epitaxially grown over the continuous outer surface 118 of raised S/D region 102.

Figure 4A:
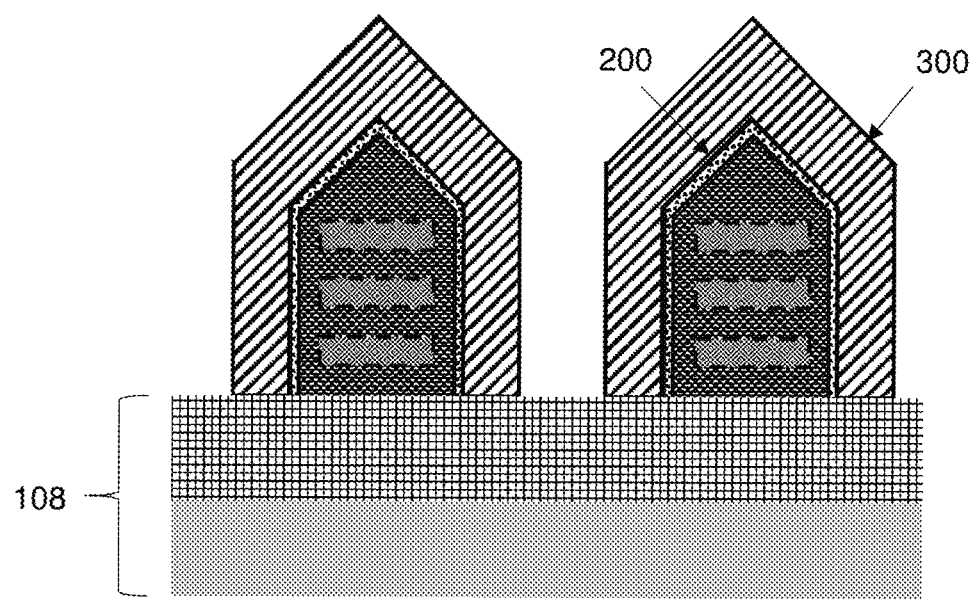
FIG. 4A shows a cross-sectional view, along line X-X in FIG. 1, of forming a sacrificial layer on the etch-stop layer in accordance with the present disclosure.
Figure 4B:
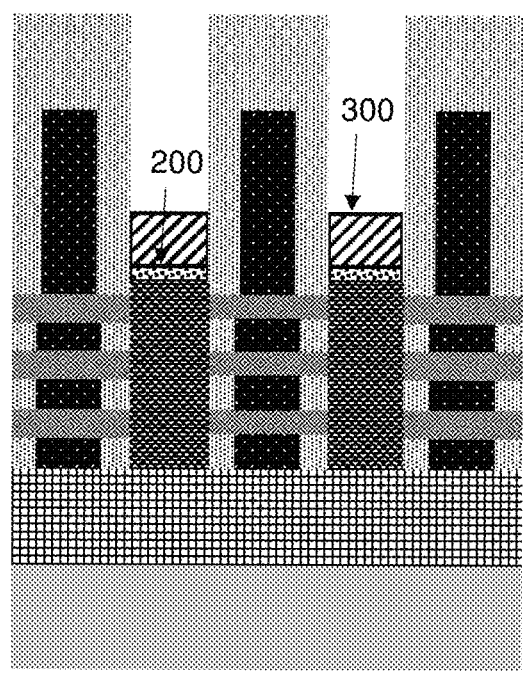
FIG. 4B shows a cross-sectional view, along line Y-Y in FIG. 1, of forming the sacrificial layer on the etch-stop layer in accordance with the present disclosure.

FIGS. 4A and 4B show a step of forming a sacrificial layer 300 over of etch-stop layer 200. Etch-stop layer 200 may be formed of a different material than sacrificial layer 300 such that sacrificial layer 300 may later be removed while leaving etch-stop layer 200 intact. In one embodiment, etch-stop layer 200 and sacrificial layer 300 may have a different etch selectivity. In one embodiment, sacrificial layer 300 may be formed to a thickness of 5-15 nanometers. In one embodiment, sacrificial layer 300 may be epitaxially grown over etch-stop layer 200. In one embodiment, sacrificial layer 300 may be formed of silicon germanium (SiGe). In one embodiment, sacrificial layer may include SiGe with a germanium percentage of 25% -50% (SiGe25). While shown as one layer, sacrificial layer 300 may include a number of layers.

Figure 5A:
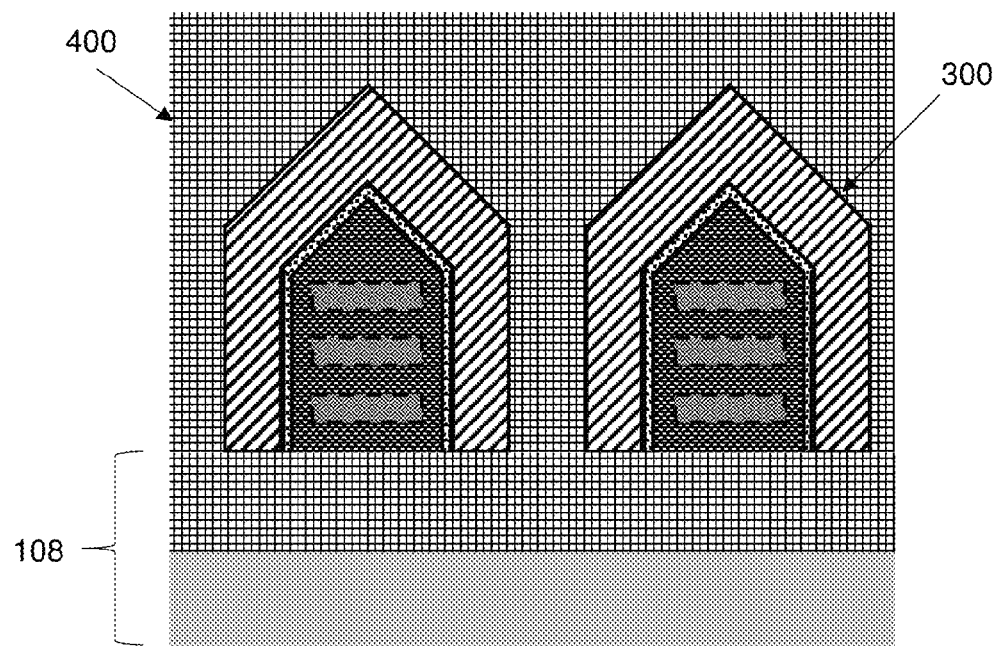
FIG. 5A shows a cross-sectional view, along line X-X in FIG. 1, of replacing dummy gates with metal gates in accordance with the present disclosure.
Figure 5B:
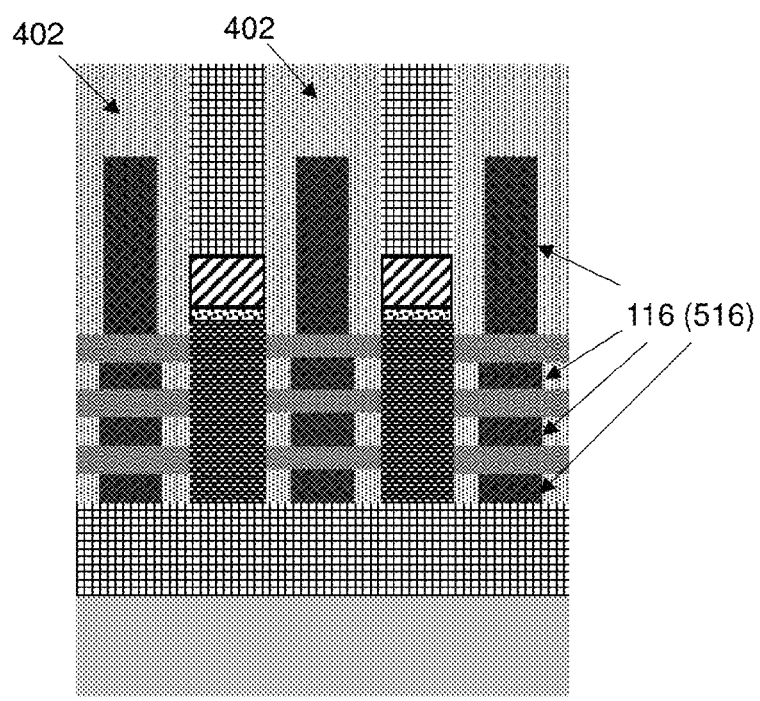
FIG. 5B shows a cross-sectional view, along line Y-Y in FIG. 1, of replacing the dummy gates with metal gates in accordance with the present disclosure.

FIGS. 5A and 5B show a step of depositing a dielectric layer 400 over sacrificial layer 300. Dielectric layer 400 may include a flowable oxide. In one embodiment, dielectric layer 400 may be formed by chemical vapor deposition (CVD), high-density plasma chemical vapor deposition (HDP-CVD), or a high-aspect ratio process (HARP). Dielectric layer 400 may include any interlevel or intralevel dielectric material including inorganic dielectric materials, organic dielectric materials, or combinations thereof. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™

(available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one embodiment, dielectric layer 400 may include an oxide. In one embodiment, the present method may include planarization of dielectric layer 400. Planarization of dielectric layer 400 may occur by chemical mechanical polishing (CMP). In a particular embodiment, planarization of dielectric layer 400 may occur by poly-open CMP (POC). The present method may optionally include a replacement-metal-gate (RMG) process. In such an embodiment, original gate 116 may be a dummy gate 416 formed of a semiconducting material. During the optional RMG process, dummy gate 416 and sacrificial layers 114 may be removed and replaced with a metal gate 516 having a high dielectric constant (high-k). In one embodiment, metal gate 516 may have a dielectric constant of 3.9 or higher. Dummy gate 416 may be removed by an etch selective to nanosheets 106. In one embodiment, dummy gate 416 includes amorphous silicon (a-Si) disposed on a thin silicon dioxide ($SiO_2$) layer. In such an embodiment, removal of dummy gate 416 may include removing the a-Si selective to $SiO_2$ followed by a brief $SiO_2$ removal to expose nanosheets 106 and at least one of sacrificial layers 114. In one embodiment, the a-Si may be removed selective to $SiO_2$ by a wet hot ammonia etch, or a tetramethylammonium hydroxide (TMAH) wet etch. The thin $SiO_2$ layer may be removed by a dilute hydrofluoric acid (DHF) etch. Sacrificial layers 114 may be removed by a selective SiGe removal process now known or later developed, such as a wet etch or a dry etch. Metal gate 516 may be formed by atomic layer deposition (ALD), thermal atomic layer deposition, or any other method of depositing a high-k metal now known or later developed. The present method may also include formation of self-aligned contact (SAC) caps 402 over gate 116, 516. SAC caps 402 may be formed of a material resistant to an etch chemistry used for dielectric layer 400. In one embodiment where dielectric layer 400 includes silicon dioxide ($SiO_2$), SAC caps 402 may include silicon nitride (SiN), siliconborocarbonitride (SiBCN), silicon oxycarbide (SiCO), or silicon oxycarbonitride (SiOCN).

Figure 6A:
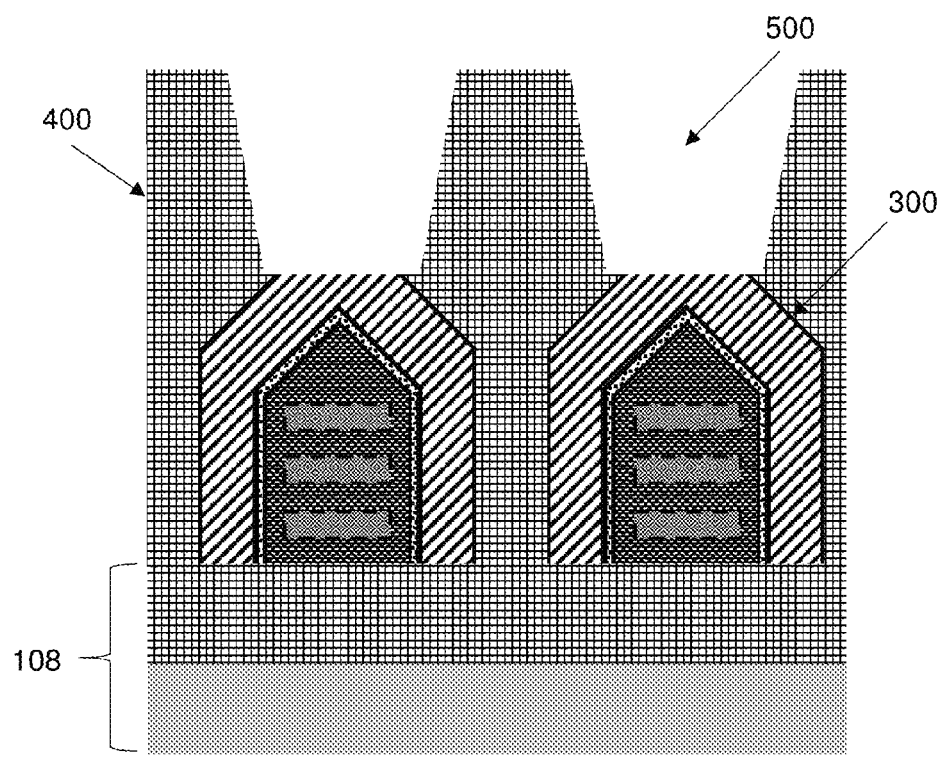
FIG. 6A shows a cross-sectional view, along line X-X in FIG. 1, of exposing a top portion of the sacrificial layer in accordance with the present disclosure.
Figure 6B:
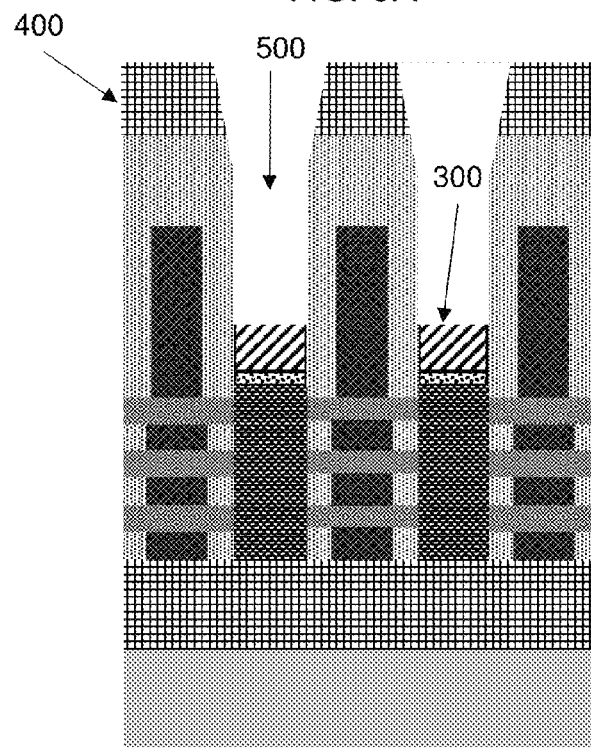
FIG. 6B shows a cross-sectional view, along line Y-Y in FIG. 1, of exposing the top portion of the sacrificial layer in accordance with the present disclosure.

FIGS. 6A and 6B show a step of removing an upper portion 500 of dielectric layer 400 to expose a portion of sacrificial layer 300. Upper portion 500 of dielectric layer 400 may be removed by a patterned etch using a mask or any other method of selectively removing an oxide that is now known or later developed. In one embodiment, the removed upper portion 500 of dielectric layer 400 may be misaligned with underlying sacrificial layer 300. However, as will be described, some misalignment can occur.

Figure 7A:
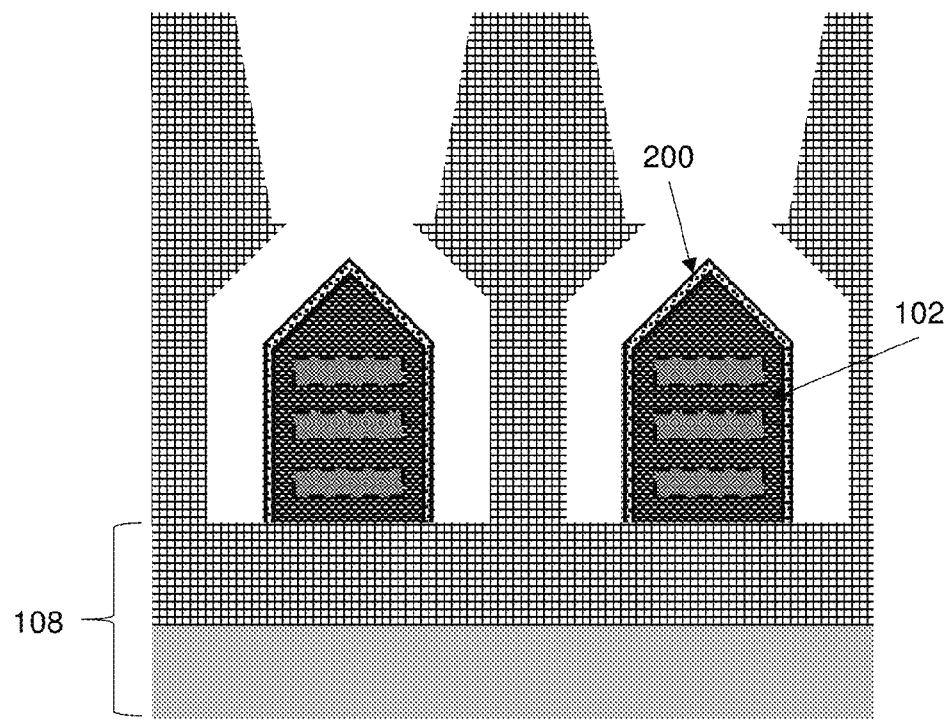
FIG. 7A shows a cross-sectional view, along line X-X in FIG. 1, of removing the sacrificial layer selective to the etch-stop layer in accordance with the present disclosure.
Figure 7B:
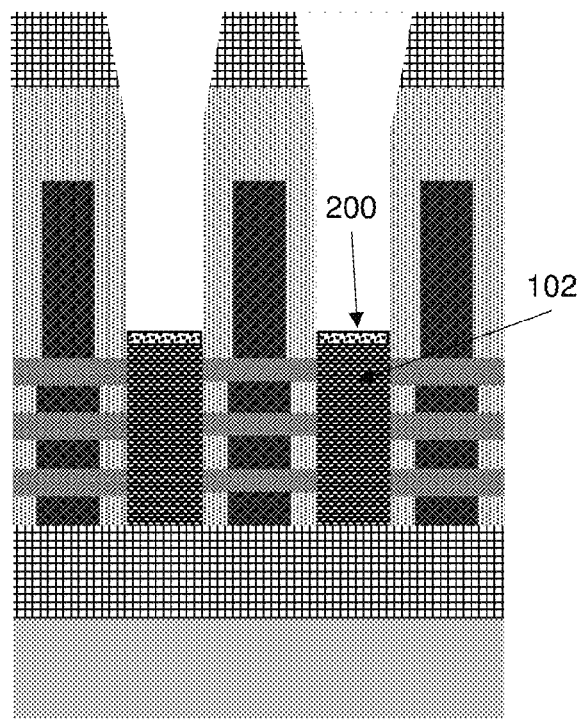
FIG. 7B shows a cross-sectional view, along line Y-Y in FIG. 1, of removing the sacrificial layer selective to the etch-stop layer in accordance with the present disclosure.

FIGS. 7A and 7B show a step of removing sacrificial layer 300 selective to etch-stop layer 200. In one embodiment, sacrificial layer 300 may be removed by an etch process selective to etch-stop layer 200, or any other method of selectively removing material now known or later developed. As will be discussed in further detail below, etch-stop layer 200 may optionally be removed with a separate etch that is selective to S/D region 102.

Figure 8A:
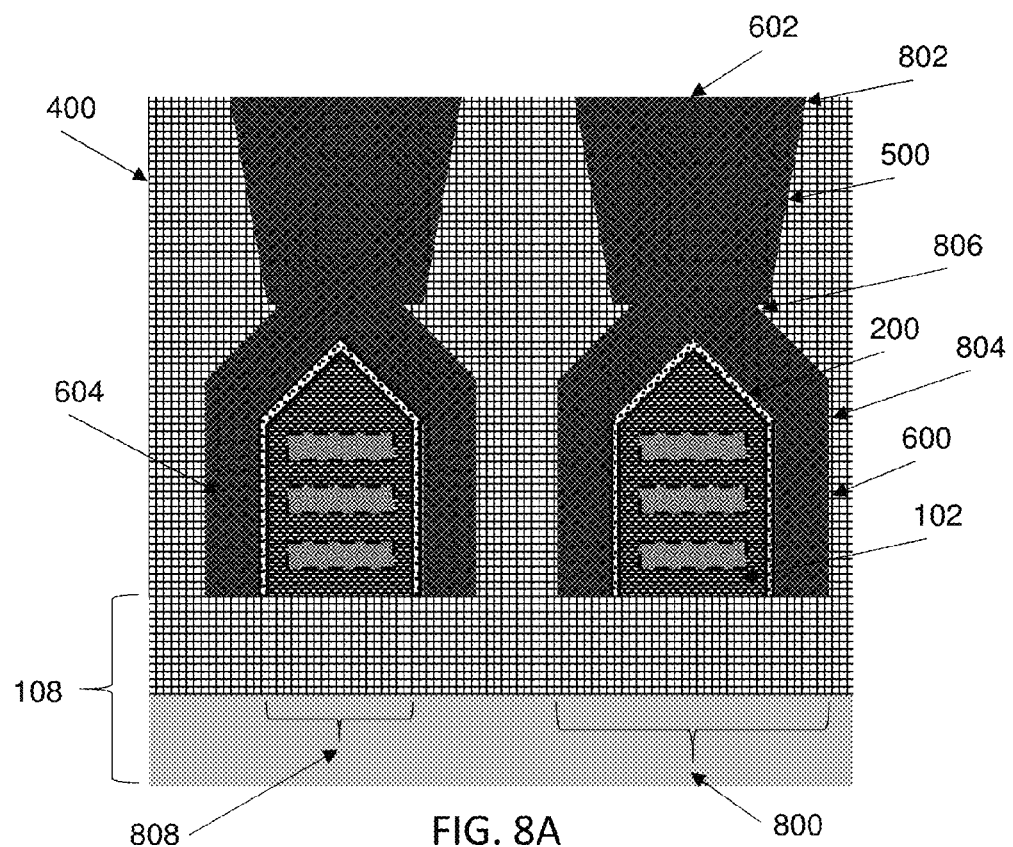
FIG. 8A shows a cross-sectional view, along line X-X in FIG. 1, of forming a wrap-around contact (WAC) over the etch-stop layer in accordance with the present disclosure.
Figure 8B:
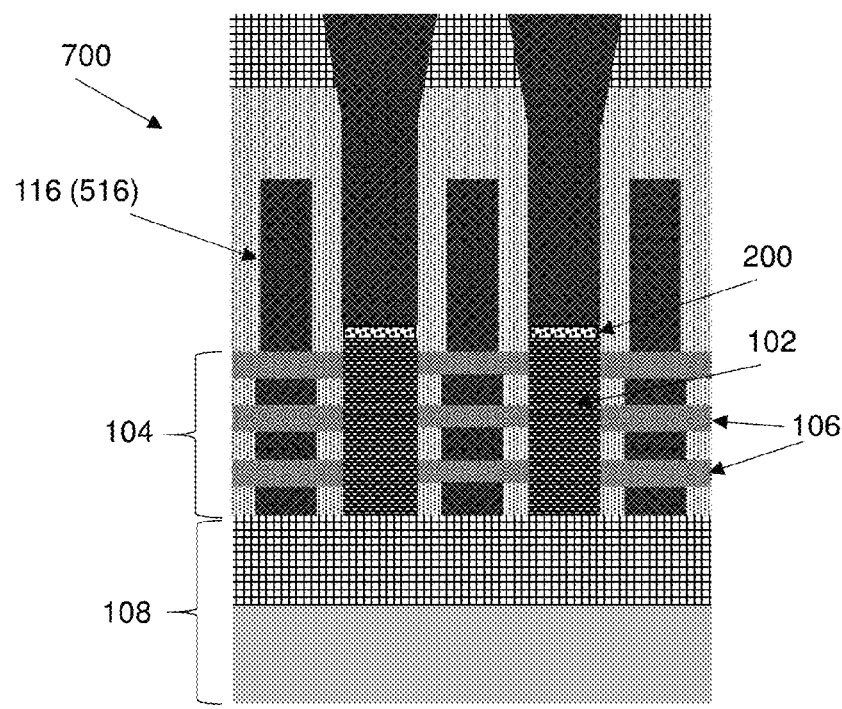
FIG. 8B shows a cross-sectional view, along line Y-Y in FIG. 1, of forming the wrap-around contact (WAC) over the etch-stop layer in accordance with the present disclosure.
Figure 10A:
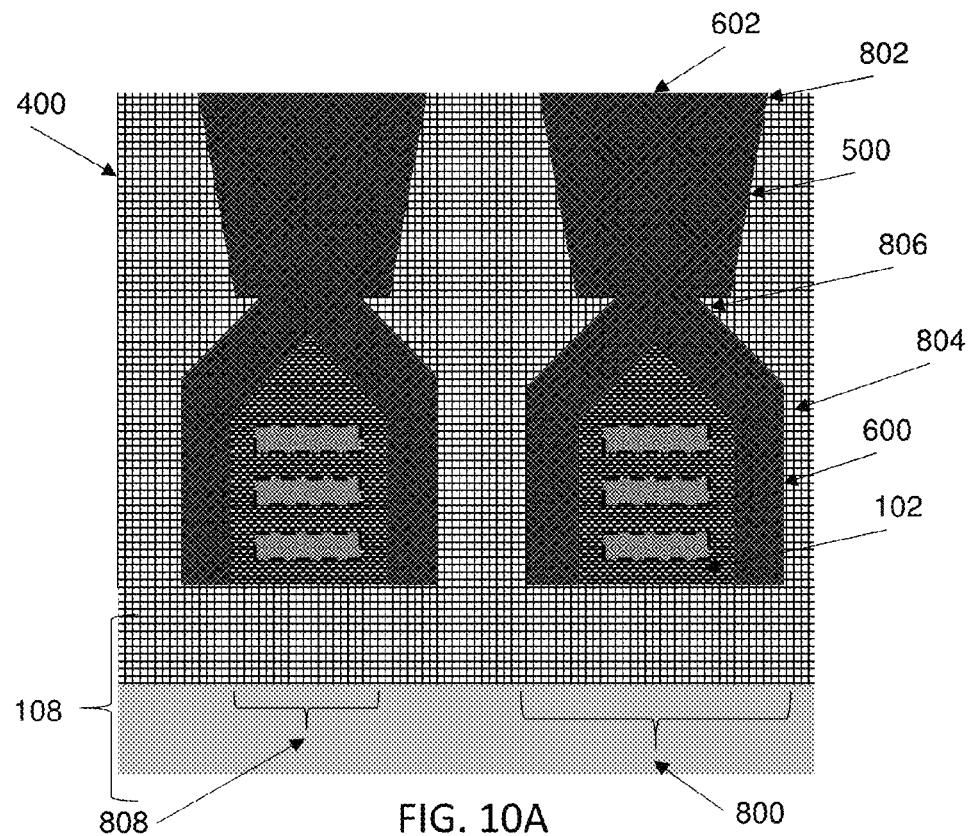
FIG. 10A shows a cross-sectional view, along line X-X in FIG. 1, of forming the wrap-around contact (WAC) over the source/drain region in accordance with the present disclosure.
Figure 10B:
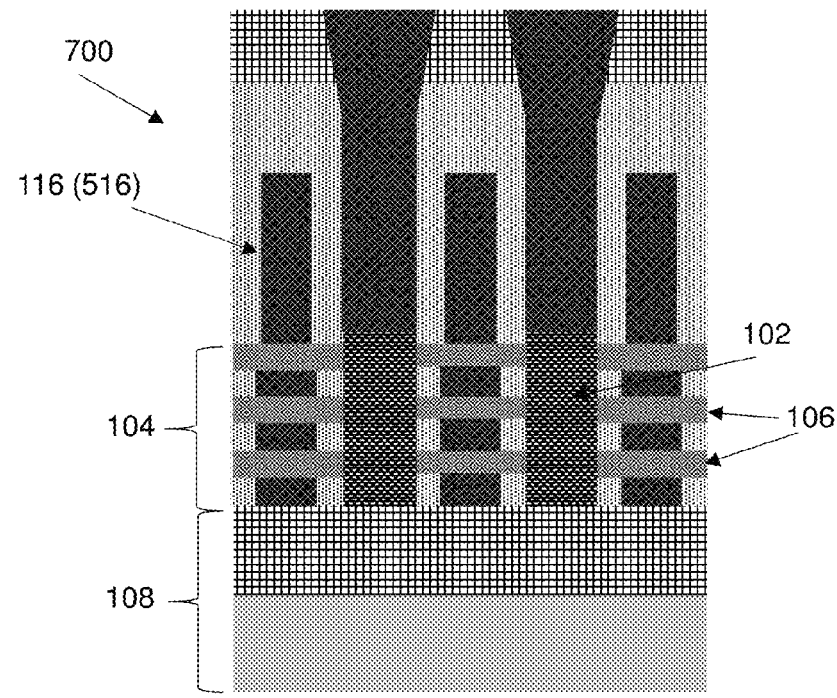
FIG. 10B shows a cross-sectional view, along line Y-Y in FIG. 1, of forming the wrap-around contact (WAC) over the source/drain region in accordance with the present disclosure.

FIGS. 8A and 8B show a step of depositing a wrap-around contact 600 over each etch-stop layer 200. In this embodiment, etch-stop layer 200 may not be removed prior to forming wrap-around contact 600. The process shown also forms a second contact 602 over wrap-around contact 600 in dielectric layer 400. In one embodiment, wrap-around contact 600 and second contact 602 may formed of the same material in a single step. In another embodiment, wrap-around contact 600 may be formed of a different material than second contact 602. In one embodiment, wrap-around contact 600 may include a silicide formed by depositing a thin metal liner (not shown) over the semiconducting material of etch-stop layer 200 (or over the semiconducting material of S/D region 102 in an embodiment where etch-stop layer 200 is removed prior to forming wrap-around contact 600, as shown in FIGS. 10A and 10B). The thin metal liner may include titanium (Ti), platinum-doped nickel (NiPt), NiPtTi alloy, platinum (Pt), titanium aluminide (TiAl), or titanium carbide (TiC). In one embodiment, the thin metal liner forms a silicide with the semiconducting material on which it is deposited. The thin metal liner may sometimes be referred to as a liner silicide. In such an embodiment, the silicide may form as a result of the thermal budget from depositing the bulk metal 604 of the wrap-around contact 600 on the thin metal liner. Bulk metal 604 of wrap-around contact 600 may include tungsten (W), ruthenium (Ru), cobalt (Co), copper (Cu), or aluminum (Al). In such an embodiment, second contact 602 may be formed of the same bulk metal 604 as the wrap-around contact 600.

In a different embodiment, forming wrap-around contact 600 may include forming a silicide by chemical vapor deposition (CVD) of a metal, e.g., titanium (Ti) followed by an anneal to form silicide with the underlying semiconductor material and then removal of the metal, or may include atomic layer deposition (ALD) of tantalum silicide (TaSi). Wrap-around contact 600 may then also include deposition of a refractory metal liner (not shown) inside of dielectric layer 400 and deposition of a conductor. Refractory metal liner may include ruthenium; however, other refractory metals such as tantalum (Ta), titanium (Ti), tungsten (W), iridium (Ir), rhodium (Rh) and platinum (Pt), etc., or mixtures of thereof, may also be employed. Second contact 602 may be formed by, for example, deposition of a refractory metal liner followed by a conductor. For example, it may be formed by atomic layer deposition (ALD) of ruthenium (Ru) followed by chemical vapor deposition (CVD) of fluorine-free tungsten (FFW) or cobalt (Co). In one embodiment, second contact 602 may constitute what is referred to as a trench silicide (TS) contact.

Figure 9A:
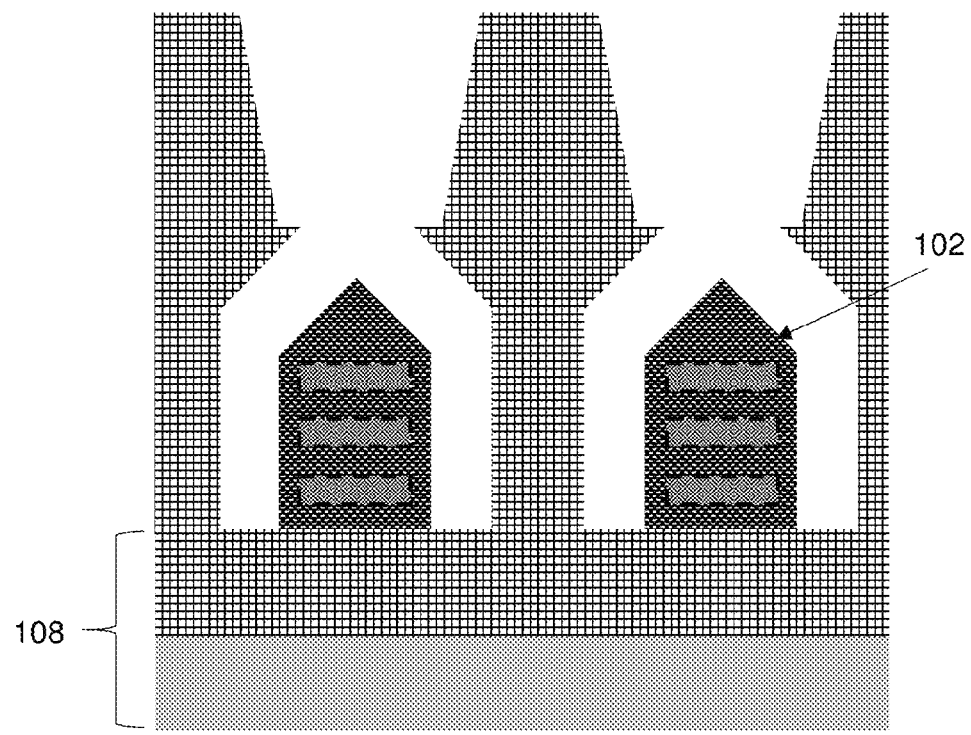
FIG. 9A shows a cross-sectional view, along line X-X in FIG. 1, of optionally removing the etch-stop layer selective to the source/drain region in accordance with the present disclosure.
Figure 9B:
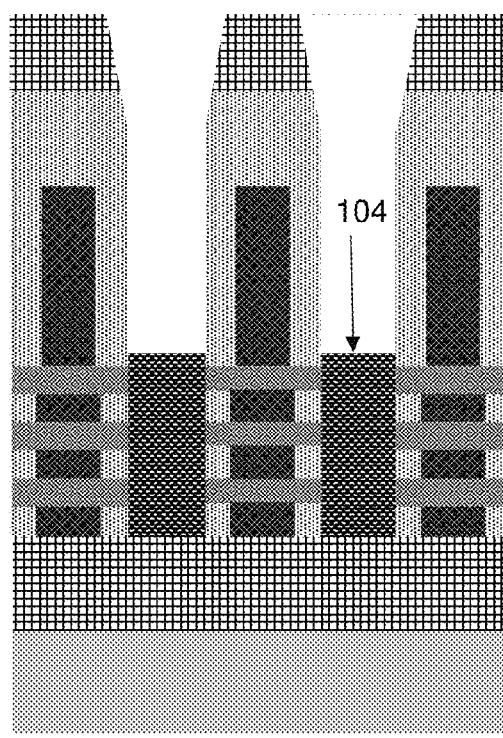
FIG. 9B shows a cross-sectional view, along line Y-Y in FIG. 1, of optionally removing the etch-stop layer selective to the source/drain region in accordance with the present disclosure.

FIGS. 9A and 9B show the optional step of removing etch-stop layer 200 prior to depositing wrap-around contact 600 (after the step shown in FIGS. 7A and 7B). As discussed above, etch-stop layer 200 may be removed by an etch selective to S/D region 102. In one embodiment, etch-stop layer 200 may be removed by an isotropic etch such as wet silicon trimming, or a Frontier process.

FIGS. 10A and 10B show a step of depositing wrap-around contact 600 after the optional step of removing etch-stop layer 200. The steps shown in FIGS. 10A and 10B are described above regarding FIGS. 8A and 8B, with the exception that in this embodiment, etch-stop layer 200 is removed prior to forming wrap-around contact 600. As a result, wrap-around contact 600 may be formed directly on S/D/region 102.

The present method provides a plurality of nanosheet transistors 700. Each of the nanosheet transistors 700 includes nanosheet stack 104 disposed on substrate 108. Metal gate 116 (516) may be disposed on nanosheet stack 104. An S/D region 102 is disposed on substrate 108 adjacent to nanosheet stack 104 such that nanosheets 106 extend between portions of S/D region 102. A silicon etch-stop layer 200 may be disposed on the S/D region 102. Wrap-around contact 600 may be wrapped around silicon etch-stop layer 200. In one embodiment, particularly in the case of a PFET, S/D region 102 may include silicon germanium (SiGe). In such an embodiment, silicon etch-stop layer 200 may be formed on SiGe S/D region 102, and wrap-around contact 600 may be formed on silicon etch-stop layer 200. Second contact 602 may be disposed on wrap-around contact 600. Second contact 602 may be contained within a span 800 of wrap-around contact 600. Such a configuration enables device scaling that may not be limited by a width of second contact 602. Even in a situation where second contact 602 is misaligned with wrap-around contact 600 in a worst-case scenario misalignment, second contact 602 may be contained within a span 800 of wrap-around contact 600. In one embodiment, a widest portion 802 of second contact 602 may be narrower than a widest portion 804 of wrap-around contact. In one embodiment, an interface 806 between wrap-around contact 600 and second contact 602 may be narrower than a width 808 of one of the S/D regions 102.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a nanosheet structure on a substrate, the nanosheet structure including a gate disposed on a plurality of nanosheets;
   forming a raised source/drain (S/D) region on the substrate adjacent to the nanosheet structure such that the nanosheets extend between the raised S/D region, and the raised S/D region has a continuous outer surface that includes an upper surface and a side surface;
   forming an etch-stop layer on the continuous outer surface of the raised S/D region;
   forming a second sacrificial layer over the etch-stop layer, the etch-stop layer including a different material than the second sacrificial layer;
   depositing a dielectric layer over the second sacrificial layer;
   removing an upper portion of the dielectric layer to expose a portion of the second sacrificial layer;
   removing the second sacrificial layer selective to the etch-stop layer; and
   depositing a conductor in the removed upper portion of the dielectric layer to form a wrap-around contact over the etch-stop layer and a second contact above the wrap-around contact.

2. The method of claim 1, further comprising:
   removing the etch-stop layer prior to depositing the conductor; and
   wherein depositing the conductor includes depositing the conductor on the continuous outer surface of the raised S/D regions.

3. The method of claim 1, wherein the forming the etch-stop layer includes forming a silicon (Si) layer.

4. The method of claim 1, wherein the etch-stop layers has a thickness of 1-3 nanometers.

5. The method of claim 1, wherein the forming of the second sacrificial layer includes forming a silicon germanium (SiGe) layer.

6. The method of claim 1, wherein the second sacrificial layer has a thickness of 5-15 nanometers.

7. The method of claim 1, wherein a widest portion of the second contact is narrower than a widest portion of the wrap-around contact.

8. The method of claim 1, wherein the second contact is misaligned with the wrap-around contact, and the second contact is contained within a span of the wrap-around contact.

9. A method of forming a wrap-around contact on a nanosheet transistor, the method comprising:
   forming an etch-stop layer over a continuous outer surface of a raised source/drain (S/D) region of the nanosheet transistor;
   forming a sacrificial layer over the etch-stop layer, the etch-stop layer including a different material than the sacrificial layer;
   depositing a dielectric layer over the sacrificial layer;
   removing an upper portion of the dielectric layer to expose a portion of the sacrificial layer;
   removing the sacrificial layer selective to the etch-stop layer; and
   depositing a conductor in the removed upper portion of the dielectric layer to form a wrap-around contact and a second contact.

10. The method of claim 9, further comprising:
    removing the etch-stop layer prior to depositing the conductor; and
    depositing the conductor includes depositing a conductor to form wrap-around contact on the continuous outer surface of the raised S/D region.

11. The method of claim 9, wherein the forming of the etch-stop layer includes forming a silicon (Si) layer.

12. The method of claim 9, wherein the etch-stop layer has a thickness of 1-3 nanometers.

13. The method of claim 9, wherein the forming of the sacrificial layer includes forming a silicon germanium (SiGe) layer.

14. The method of claim 9, wherein the sacrificial layer has a thickness of 5-10 nanometers.

15. The method of claim 9, wherein a widest portion of the second contact is narrower than a widest portion of the wrap-around contact.

16. The method of claim 9, wherein the second contact is misaligned with the wrap-around contact.

17. An apparatus comprising:
    a nanosheet stack disposed on a substrate;
    a metal gate disposed on the nanosheet stack;
    a raised source/drain (S/D) region disposed on the substrate and adjacent to the nanosheet stack such that the nanosheets extend between the source/drain region;
    a silicon etch-stop layer disposed on the raised S/D region;
    a wrap-around contact wrapped around the silicon etch-stop layer; and
    a second contact disposed on the wrap-around contact, wherein a widest portion of the second contact is narrower than a widest portion of the wrap-around contact.

18. The apparatus of claim 17, wherein a width of an interface between the wrap-around contact and the second contact is narrower than a width of the source/drain region.

19. The apparatus of claim 17, wherein the raised S/D region includes silicon germanium (SiGe).

20. The apparatus of claim 19, wherein the second contact is contained within a span of the wrap-around contact.

\* \* \* \* \*